United States Patent [19]

McArthur et al.

[11] Patent Number: 5,040,045
[45] Date of Patent: Aug. 13, 1991

[54] HIGH VOLTAGE MOS TRANSISTOR HAVING SHIELDED CROSSOVER PATH FOR A HIGH VOLTAGE CONNECTION BUS

[75] Inventors: Douglas C. McArthur, Sunnyvale; Robert A. Mullen, San Jose, both of Calif.

[73] Assignee: U.S. Philips Corporation, New York, N.Y.

[21] Appl. No.: 525,288

[22] Filed: May 17, 1990

[51] Int. Cl.$^5$ .................. H01L 29/40; H01L 29/68; H01L 29/78; H01L 29/92

[52] U.S. Cl. .................... 357/53; 357/23.5; 357/23.6; 357/23.8; 357/23.14

[58] Field of Search ............ 357/53, 23.14, 23.8, 357/23.5, 23.6

[56] References Cited

U.S. PATENT DOCUMENTS

| | | | |
|---|---|---|---|
| 4,300,150 | 11/1981 | Colak | 357/23.8 |
| 4,319,262 | 3/1982 | Bertotti et al. | 357/53 |
| 4,430,583 | 2/1984 | Shoji | 357/23.14 |
| 4,651,186 | 3/1987 | Yamamoto et al. | 357/23.14 |
| 4,654,680 | 3/1987 | Yamazaki | 357/23.6 |
| 4,766,474 | 8/1988 | Nakagawa et al. | 357/53 |
| 4,881,106 | 11/1989 | Barron | 357/53 |
| 4,926,243 | 5/1990 | Nakagawa et al. | 357/23.14 |

FOREIGN PATENT DOCUMENTS

| | | | |
|---|---|---|---|
| 53-008080 | 1/1978 | Japan | 357/23.8 |
| 56-007479 | 1/1981 | Japan | 357/23.14 |
| 56-038867 | 4/1981 | Japan | 357/23.8 |
| 56-133871 | 10/1981 | Japan | 357/23.8 |
| 61-003458 | 1/1986 | Japan | 357/23.14 |

OTHER PUBLICATIONS

Martin et al., "850V NMOS Driver with Active Output", IEDM 1984, pp. 266-269.

Primary Examiner—Andrew J. James
Assistant Examiner—Daniel Kim
Attorney, Agent, or Firm—Leroy Eason

[57] ABSTRACT

An MOS transistor having a closed layout plan in which the drain is laterally surrounded by the source and gate and having an extended charge carrier drift zone between the gate and drain, thereby achieving high reverse breakdown voltage. An oxide or other dielectric layer is provided on the surface of the drift zone, and on such layer between the gate and drain electrodes a crossover path is formed by a succession of unconnected narrow conductive strips extending transversely to such path and having a dielectric coating thereon. A high voltage external connection bus for the drain electrode traverses such crossover path and extends through a gap formed by a disjuncture in the gate and source electrodes. Since the length of each of the conductive strips greatly exceeds the width of the connection bus, the coupling capacitance between each strip and such bus in much less than the coupling capacitance between such strip and the underlying portion of the drift zone. The drift zone can thereby be effectively shielded from the electric field of the connection bus by including a sufficient number of conductive strips in the crossover path traversed by the connection bus.

6 Claims, 5 Drawing Sheets

HIGH VOLTAGE MOS TRANSISTOR HAVING SHIELDED CROSSOVER PATH FOR A HIGH VOLTAGE CONNECTION BUS

BACKGROUND OF THE INVENTION

1. Field of the Invention

The invention relates to an MOS transistor having an extended charge carrier drift zone between the gate and drain to achieve high reverse breakdown voltage, and particularly to such a transistor having a closed layout plan wherein the drain is laterally surrounded by the source and the gate so that a high voltage connection bus for the drain must traverse a path which crosses the drift zone. The term "MOS transistor" as used herein refers to a field effect transistor having a source, a drain and a gate, the gate electrode extending over a dielectric layer, for example silicon oxide or nitride, at the surface of the transistor; the gate electrode when energized causing either enhancement or depletion of charge carriers in an underlying surface channel of the transistor which constitutes the gate between the source and the drain. 2. Description of the Related Art There is an increasing need for MOS integrated circuits which can sustain high reverse breakdown voltages. That is, wherein the drains of one or more MOS transistors therein may be subjected to voltages of the order of several hundred volts relative to the source. U.S. Pat. No. 4,300,150, issued Nov. 10, 1981, assigned to the present assignee, discloses a double-diffused MOS transistor (DMOS) wherein high reverse breakdown voltage is achieved by providing an extended charge carrier drift zone in an epitaxial layer between the gate and drain in order to provide a gradual distribution of the drain potential over the length of the drift zone. However, in order to minimize the area of such a transistor on an IC chip, it is advantageous to employ a closed layout plan wherein the source and gate are at the periphery and surround the drain. Consequently, in order for a high voltage external connection bus to reach the drain, it must extend over the drift zone between the gate and drain. The electric field produced by the bus will therefore influence the flow of charge carriers in the drift zone, and unless adequately shielded will degrade the operation of the transistor.

The article "400V MOS IC For EL Display" by K. Fujii et al, p. 46–47, 1981 IEEE International Solid State Circuits Conference, describes an MOS transistor having an extended drift zone and a closed layout plan in which the drain is surrounded by the source and gate at the periphery of the layout. A pair of layers of concentric annular field plates which are unconnected ("floating" in potential) are provided between the gate and drain to reduce enhancement of the electric field produced in the drift zone by the field plates, thereby avoiding reduction of the reverse breakdown voltage of the transistor due to such electric field. However, the article does not address the problem of how a high voltage connection bus can be extended to the drain without the electric field therefrom effecting the drift zone.

The article "850V NMOS Driver With Active Outputs" by R. Martin et al, 1984 IEDM, p. 266–269, also describes a high voltage MOS transistor with an extended drift zone and having a closed layout plan. A double layer of successive polysilicon field plates extends across the drift zone, the upper layer of the field plates being described as serving to shield the substrate from the field potential of a high voltage bus. However, there is no description of how to extend the connection bus across the gate and source electrodes or of how to further improve the shielding of the drift zone.

SUMMARY OF THE INVENTION

A high voltage MOS transistor in accordance with the invention has a closed layout plan, preferably a substantially rectangular partially interleaved layout, wherein the drain is laterally surrounded by the source and the gate. A charge carrier drift zone extends from the gate to the drain and an oxide or other dielectric layer is provided on the surface of such drift zone between the gate and drain electrodes. An elongated high voltage connection bus extends to the drain electrode. A plurality of unconnected conductive strips are provided in succession on the dielectric layer to form a crossover path between the gate and drain electrodes, such strips extending in a direction substantially transverse to the direction of such crossover path, each strip having a length substantially exceeding the width of the connection bus over the crossover path and having a further dielectric layer thereon. The gate and source electrodes are provided with a disjuncture therein, forming a gap through which the connection bus extends and traverses the crossover path formed by the conductive strips in contact with the dielectric layer thereon. Each conductive strip thus forms a coupling capacitance $C_{ci}$ with the connection bus and further forms a coupling capacitance $C_{di}$ with the drift zone, such that $C_{ci} << C_{di}$. As a result, the electric potential between the connection bus and the drift zone is produced substantially across the coupling capacitance $C_{ci}$, thereby effectively shielding the drift zone from the electric field produced by the connection bus.

BRIEF DESCRIPTION OF THE DRAWINGS

A more complete description of preferred embodiments of the invention is given below with reference to the accompanying drawings, in which.

DESCRIPTION OF THE PREFERRED EMBODIMENTS

Figure 1:
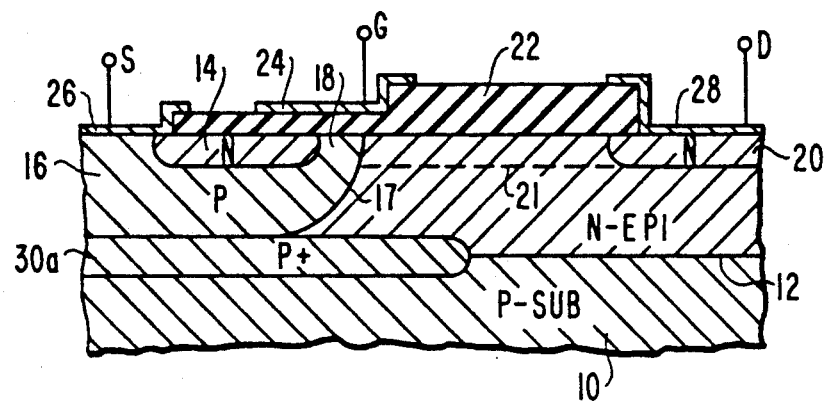
FIG. 1 is a cross-section of the structure of a high voltage MOS transistor such as may be employed in a transistor in accordance with the invention.

In FIG. 1 is shown a cross-section of the structure of a high voltage lateral double diffused N-channel enhancement mode MOS transistor (i.e., an LDMOS transistor), substantially as set forth in the above-referenced U.S. Pat. No. 4,300,150, which is hereby incorporated by reference. The silicon substrate 10 is of lightly doped P-type conductivity, with an epitaxial N-type surface layer 12 therein. Diffused into a surface portion of such epitaxial layer and bounding it is a P-type zone 16 forming a P-N junction 17 therewith, and diffused into a surface portion of zone 16 is an N-type zone which constitutes the source 14. The portion of P-type zone 16 which extends beyond source 14 forms a channel at the surface which constitutes the gate 18. At a laterally distant portion of epitaxial layer 12 is a diffused N-type zone which constitutes the drain 20. A silicon oxide surface layer 22 is formed over epitaxial layer 12, extending over a portion of drain 20 and also, with reduced thickness, over gate 18 and a portion of source 14. A charge carrier drift zone 21 extends in a surface portion of epitaxial layer 12 between gate 18 and drain 20.

A metallized source electrode 26 is formed over the surface portion of source 14 not covered by oxide layer 22, and also extends over the portion of P-type zone 16 which continues past source 14. Source electrode 26 is therefore in ohmic connection with the P-type substrate, so that the source and substrate will be at the same potential. This is typical of high voltage MOS transistors, the source and substrate both being grounded. A metallized drain electrode 28 is formed over drain 20. The electric field produced by the drain potential will therefore linearly decrease along the length of the drift zone from drain 20 to gate 18.

As shown in FIG. 1 and described in U.S. Pat. No. 4,300,150, an ion-implanted buried P+ region 30a has been provided at the junction between substrate 10 and epitaxial layer 12 in the vicinity of P-type region 16. This serves to reduce the field intensity at the junction of region 16 with epitaxial layer 12, thereby further enhancing the reverse breakdown voltage of the transistor.

Figure 2:
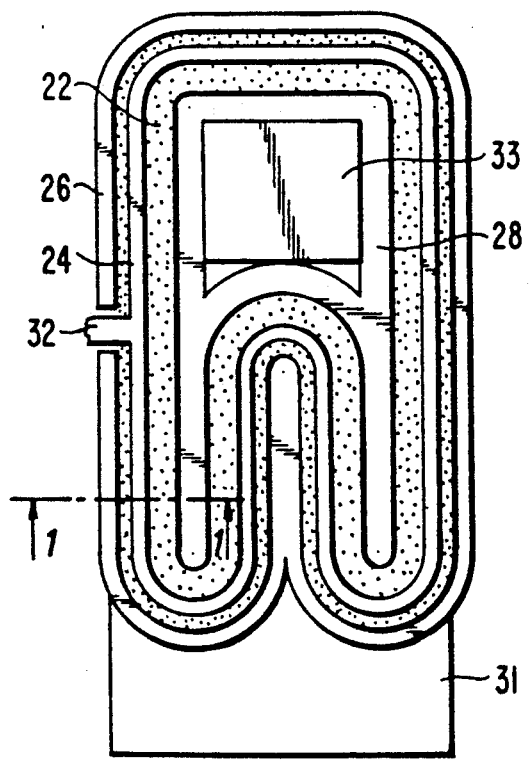
FIG. 2 is a diagram of a typical layout plan of the transistor in FIG. 1.

FIG. 2 shows the layout plan of the transistor shown in cross-section in FIG. 1. Such plan is substantially rectangular, but has a finger-like interleaved portion at the lower end thereof to achieve increased effective lengths of the source, gate and drain and, consequently, increased power and lower resistance ratings of the transistor. A cross-section taken at 1—1 in FIG. 2 will be as shown in FIG. 1, and the identifying numerals in FIG. 2 correspond to those in FIG. 1. The drain electrode 28 is surrounded by the gate and source electrodes 24 and 26, which are around the periphery of the layout plan, and has downwardly extending fingers which interleave with upwardly extending fingers of the source and gate electrodes at the bottom of the layout. The source and gate electrodes, and the underlying source zone 14 and gate zone 18 (not visible), are maintained at a constant spacing from drain electrode 28 and the underlying drain zone 20 (not visible) over the entire layout, such spacing being where the drift zone 21 (not visible) exists under the oxide layer 22. A metal contact pad 31 is in electrical contact with source electrode 26. Another metal contact pad 32 is in electrical contact with gate electrode 24, reaching it through a gap provided for that purpose in source electrode 26. A third contact pad 33, for connection to an external high voltage connection bus, is in electrical contact with drain electrode 28. It is clear from FIG. 2 that in order for an external high voltage connection bus in a parallel plane to reach drain contact pad 33, it must cross over the source and gate electrodes and extend over the drift zone.

Figure 3:
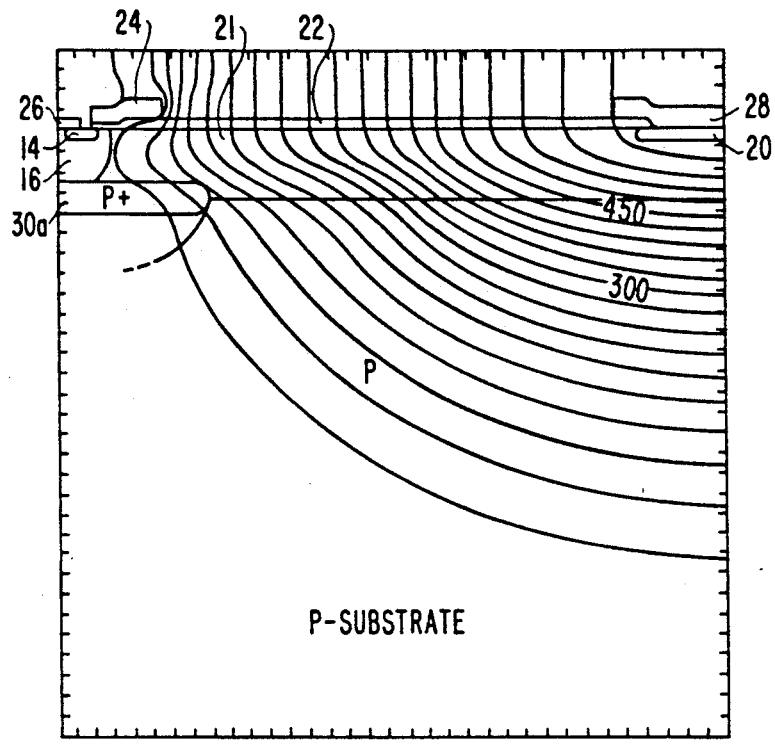
FIG. 3 is a diagram of the electric field distribution in the drift zone of the transistor in FIG. 1.

Referring to FIG. 3, there is shown the electric field distribution produced in drift zone 21 of the transistor in FIG. 1 when the drain is at a potential of 500V relative to the source. It is this field distribution that should be preserved despite the presence of the electrical field produced by a high voltage connection bus extending in a parallel plane over drift zone 21 and across gate and source electrodes 24 and 26.

Figure 4:
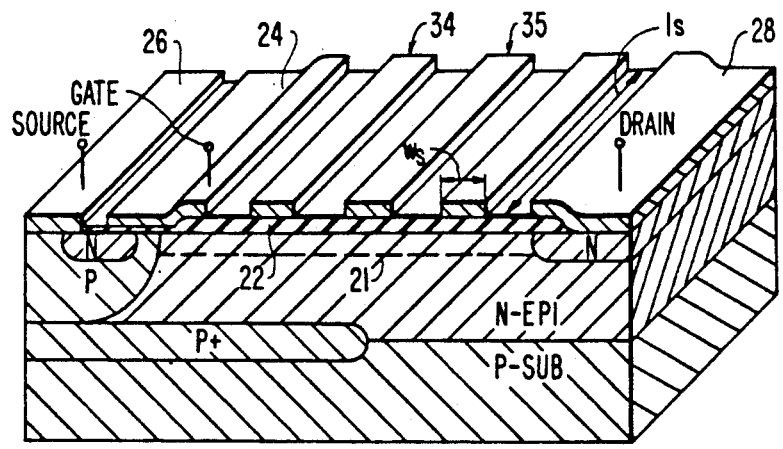
FIG. 4 is a projection view of the basic structure of a transistor in accordance with the invention.
Figure 4A:
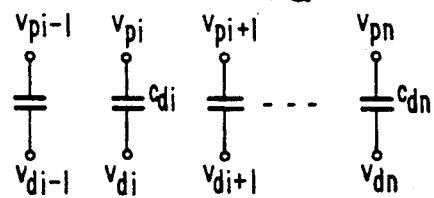
FIG. 4a shows coupling capacitances involved in such structure.

FIG. 4 is a projection view of the basic structure of the transistor in accordance with the invention, and elements therein the same as those in FIG. 1 have the same reference numerals. It is seen that on the oxide layer 22 over the drift zone, between gate electrode 24 and drain electrode 28, there is provided a succession of conductive strips 34, 35 . . . n, forming a crossover path between the gate and drain electrodes, such strips extending in a direction transverse to such crossover path. They may be doped polycrystalline silicon ("polysilicon"), and are floating in potential since they are electrically unconnected. As many such strips as possible should be included in order for each strip to intercept only a substantially constant incremental portion of the changing electric field distribution along the length of drift zone 21, as shown in FIG. 3. The distance between the gate and drain electrodes may typically be about 24 microns, and the minimum width of a polysilicon strip is about 2 microns. Since spacing is necessary between the strips, this leaves room for no more than 10 strips. The significance of such conductive strips can be understood with reference to FIG. 4a, showing the equivalent coupling capacitances which are formed by such strips and the electric field distribution in drift zone 21. Therein, $V_{di}$ is the potential of the drift zone at the ith strip and $v_{pi}$ is the potential of such strip. The capacitance $C_{di}$ between such strip and the underlying portion of the drift zone will therefore be $$C_{di} = K \frac{l_s \cdot w_s}{t_{ox}} \qquad (1)$$

where K is a constant given by the permittivity of the oxide layer 22 over drift zone 21 in FIG. 4, $l_s$ and $w_s$ are the length and width of the conductive strip, and $t_{ox}$ is the thickness of oxide layer 22. Of course, there will also be coupling capacitances between the successive strips, but these capacitances are relatively small and have little affect on the field distribution.

Figure 5:
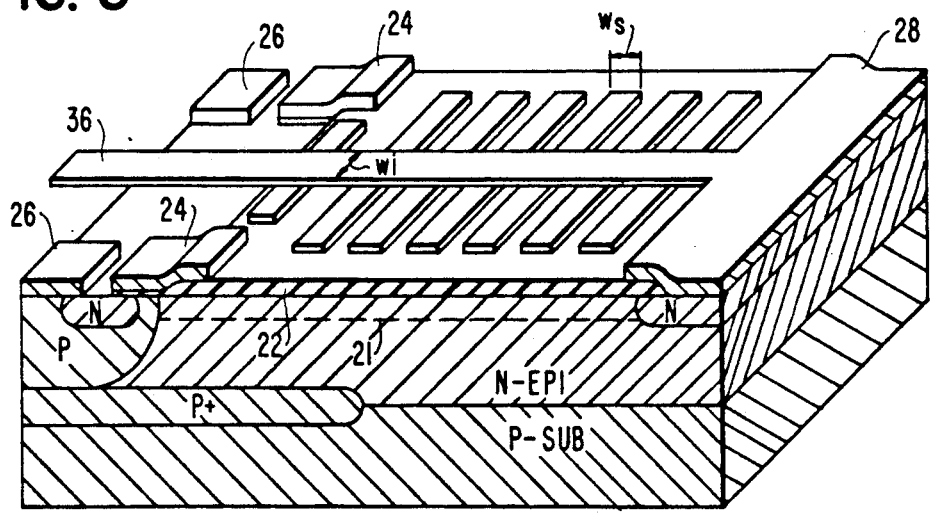
FIG. 5 is a projection view of the transistor in FIG. 4 as modified in accordance with the invention to provide for connection thereto of a high voltage external connection bus.

Turning next to FIG. 5, the transistor therein is the same as in FIG. 4 but further includes an external high voltage connection bus 36 extending in a plane parallel to the surface of the transistor and connected to drain electrode 28. A dielectric coating, such as an oxide deposited from a low temperature plasma (LTO), is formed on the conductive strips. The elongated metallic connection bus 36 traverses the crossover path formed by such strips, in contact with the oxide layer thereon. The gate and source electrodes 24 and 26 have a disjuncture therein, as shown, forming a gap which bus 36 traverses.

Figure 5A:
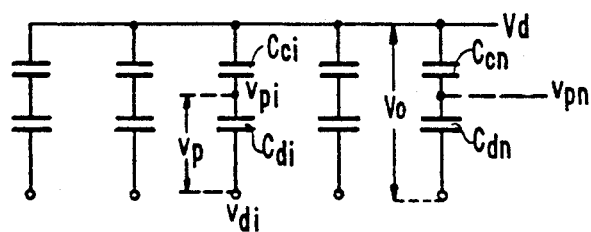
FIG. 5a shows the modified coupling capacitances of such modified structure.

The equivalent coupled capacitance circuit resulting from this configuration is shown in FIG. 5a. Therein $V_d$ is the potential of drain electrode 28 and so is also the potential of bus 36. There are now two coupling capacitances in series between bus 36 and drift zone 21 at each of the conductive strips. Namely, at the ith strip a coupling capacitance $C_{ci}$ between bus 36 and such strip, and a coupling capacitance $C_{di}$ between such strip and drift zone 21. If the potential of the ith strip is denoted $p_i$ and the potential of the portion of drift zone 21 thereunder is denoted $v_{di}$, the voltage $v_p$ between the strip and the drift zone will be $v_{pi}$-$v_{di}$ and will exist across capacitance $C_{di}$. If the voltage between bus 36 and the drift zone is denoted $V_O$, it exists across capacitances $C_{ci}$ and $C_{di}$ in series. Consequently, $$v_p = V_O \frac{C_{ci}}{C_{ci} + C_{di}} = V_O \frac{1}{1 + C_{di}/C_{ci}} \quad (2)$$

It follows that if $C_{ci} << C_{di}$, $v_p$ will be approximately zero.

The capacitance $C_{ci}$ is given by $$C_{ci} = K \frac{w_i \cdot w_s}{t_i} \quad (3)$$

where $w_i$ is the width of high voltage bus 36 and $t_i$ is the thickness of the coating layer on the conductive strips. Since the bus width $w_i$ is much less than the strip length $l_s$, and the thicknesses $t_{ox}$ and $t_i$ are approximately equal, comparison of equations (1) and (3) shows that $C_{ci}$ will be much smaller than $C_{di}$ and so from equation (2) $v_p$ will be approximately zero. This means that the conductive strips will be substantially at the same potential as the underlying portion of drift zone 21, so that drift zone 21 is effectively shielded from the electric field produced by the connection bus 36.

Figure 6A:
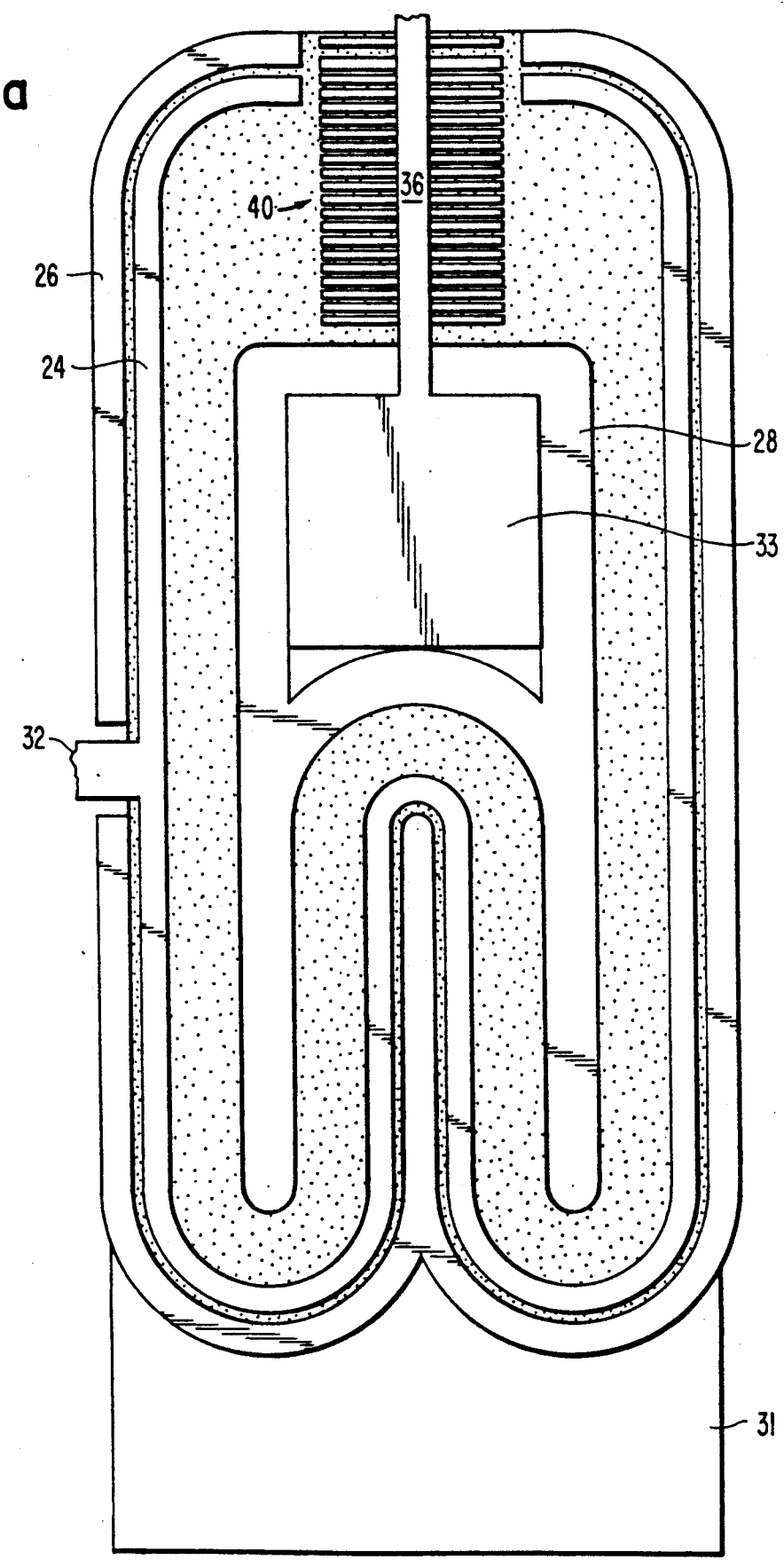
FIGS. 6a and 6b are diagrams of the coupling capacitances created by the conductive strips over the drift zones of the transistors in FIGS. 4 and 5, respectively.

Since the drain potential continuously decreases from $V_d$ at the drain electrode to zero at the source electrode, shielding of the drift zone from the high voltage bus will be increasingly effective with an increasing number of conductive strips between the electrodes, as previously noted above. In order to maximize that number the present invention can employ either of two alternative embodiments. The first is to extend the length of the transistor to provide more conductive strips along the path formed thereby between the drain and gate electrodes, and a layout plan in accordance with that embodiment is shown in FIG. 6a. The second embodiment, as shown in FIG. 6b, is to position the high voltage connection bus at a corner of a rectangular layout plan and to provide a curvilinear shoulder on the adjacent portion of the drain electrode, thereby providing an extended length of the drift zone at such corner without increasing the area of the transistor.

Referring to the rectangular layout plan in FIG. 6a, the high voltage bus 36 is connected to drain contact pad 33 and traverses a gap in the gate and source electrodes 24 and 26 at the top of the layout where a disjuncture has been provided therein as described above with reference to FIG. 5. In addition, the upper portion of the layout has been extended to increase the length of the drift zone in that region, thereby enabling a larger number of conductive strips 40 to be included between gate electrode 24 and drain electrode 28 along the crossover path traversed by connection bus 36. For example, in FIG. 6a the drift zone may be 45 microns except in the region at the top of the layout where it has been extended to 75 microns. With a strip width of 2 to 3 microns, this permits about 43 conductive strips in the crossover path followed by the connection bus over the drift zone.

Figure 6B:
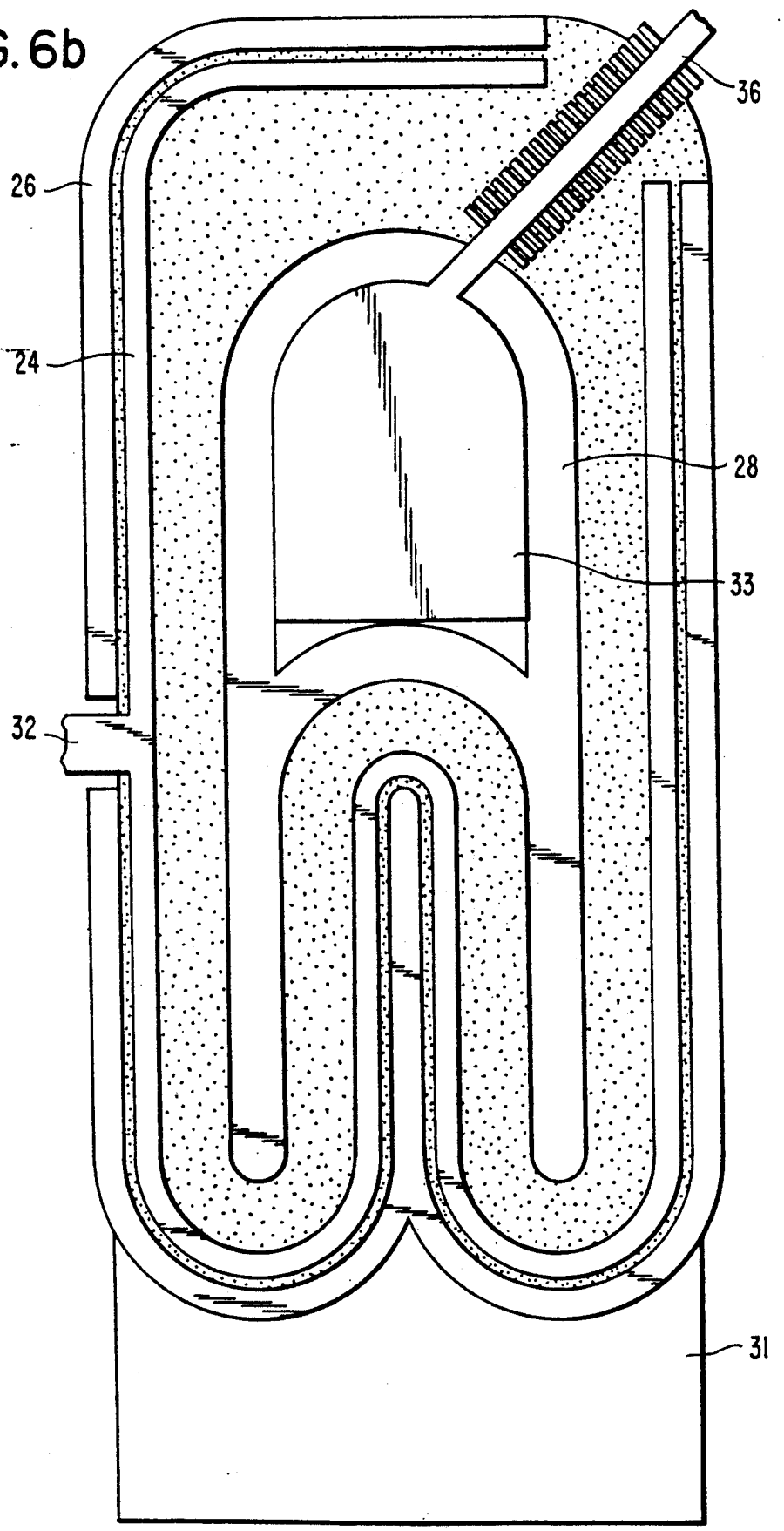

In the embodiment in FIG. 6b, the high voltage connection bus extends to drain contact pad 33 through a gap at one corner of the gate and source electrodes 24 and 26. By providing a curved shoulder on the opposite portion of drain electrode 28, the length of the drift zone at such corner is considerably increased. Consequently, a lesser or possibly no extension of the layout may still provide enough space between the gate and source electrodes for a sufficient number of conductive strips to achieve adequate shielding of the drift zone from the electric field produced by the connection bus.

Figure 7:
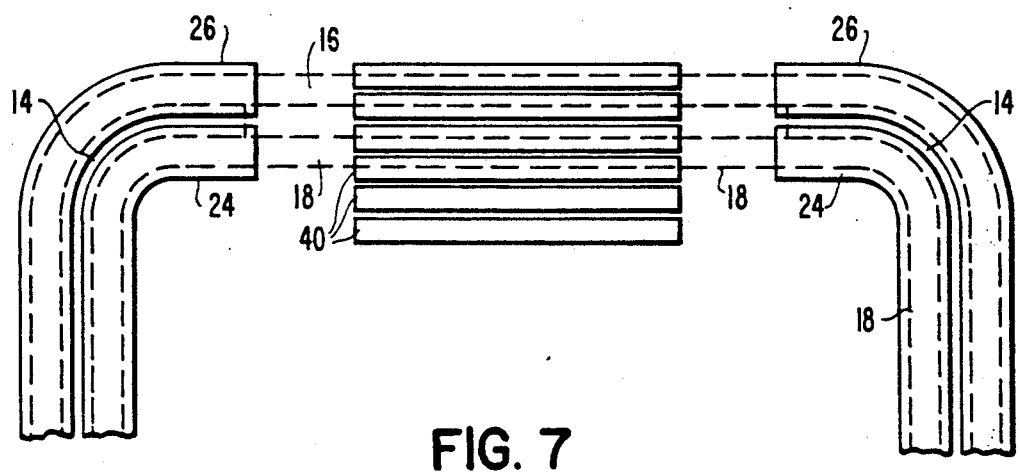
FIG. 7 is a more detailed diagram of how the disjuncture may be created in the source and gate electrodes to form a gap for the high voltage connection bus as shown in FIG. 5.

FIG. 7 shows how a disjuncture may be formed in the gate and source electrodes to provide a gap for traversal by the high voltage connection bus. The N-type source 14, which is partially overlapped (over the oxide layer thereon) by both gate electrode 24 and source electrode 26, is terminated slightly before termination of those electrodes, which are co-terminous. This leaves only the P-type channel of gate 18 and the P-type zone 16, of which gate 18 is a contiguous part as shown in FIG. 1, to continue across the gap. The N-type drift zone is thereby effectively terminated by the diode junction which exists between it and the p-type zone 16. An oxide coating is deposited on the exposed surfaces of zones 16 and 18, and the sequence of conductive strips 40 is continued across such oxide layer.

A high voltage transistor having a substantially rectangular layout plan which is extended as in FIG. 6a was constructed with a crossover path of two alternating types of doped polysilicon strips. For the first type, $C_{ci}$ was $1.55 \times 10^{-15}$ F and $C_{di}$ was $1.2 \times 10^{-14}$ F, and for the second type $C_{ci}$ was $1.3 \times 10^{-15}$ F and $C_{di}$ was $7.6 \times 10^{-13}$ F. The first series of strips were oxidized after deposition and patterning, enabling the second series to be placed close to or even overlapping the strips in the first series without danger of short-circuiting them. Such transistor also had the following further parameters:

drift zone 21: 45 microns, extended at the top to 120 microns;
oxide layer 22: 0.85 microns thick over drift zone 21;
polysilicon strips: 43 strips spaced at 0.25 microns and with an oxide layer thereon of 1 micron; the first type were each 100 microns long and 3 microns wide, and the second type were each 75 microns long and 2.5 microns wide;
interconnect bus: a rectangular metal strip 15 microns wide and 1 micron thick.

It will be apparent from the above description that the MOS transistor could conceivably have a circular layout plan, but a rectangular or substantially rectangular (such as elliptical) layout is preferable because it can be extended in only a single region. Extension of a circular layout would require an unnecessary increase in the total area of the transistor since an extended length of the drift zone is only necessary along the crossover path traversed by the connection bus.

It will also be apparent that the conductive strips are only necessary along such crossover path, rather than over the entire layout plan as had been employed in the prior art publications noted above.

While the invention has been described with reference to certain preferred embodiments thereof, it will be apparent to those skilled in the art that various modifications and adaptations thereof may be made without departing from the teachings and scope of the invention as set forth in the ensuing claims. In particular, various other MOS transistor structures could be employed so long as they have a layout plan in which the drain is surrounded by the source and gate and a charge carrier drift zone exists between the drain and the gate.

What is claimed is:

1. A high voltage MOS transistor having a source, a gate, a drain, and a charge carrier drift zone at the surface thereof extending from the gate to the drain; the transistor having a closed layout plan in which the drain is surrounded by the gate and source; respective electrodes for the source, gate and drain; a first dielectric layer on the surface of the drift zone and extending between the gate electrode and the drain electrode; and an elongated high voltage connection bus having a width and a length thereof, said length extending over said first dielectric layer to the drain electrode; said transistor being characterized in that:

a plurality of unconnected electrically conductive elongated strips are arranged in succession on said first dielectric layer to form a crossover path over which said connection bus extends from the gate electrode to the drain electrode, said elongated strips extending transversely to the crossover path, each elongated strips extending transversely to the crossover path, each elongated strip having a length at least several times the width of said connection bus and a width not exceeding the width of said connection bus, said elongated strips having a second dielectric layer thereon of approximately the same thickness as said first dielectric layer; and said gate and source electrodes having a disjuncture therein forming a gap through which said connection bus extends and traverses said crossover path, being supported by said elongated strips in contact with said second dielectric layer thereon;

each elongated strip thereby forming a coupling capacitance $C_{ci}$ with said connection bus and forming a further coupling capacitance $C_{di}$ with said drift zone, the capacitance $C_{di}$ having an area which is several times that of the capacitance $C_{ci}$ and a thicknesses of the first dielectric layer of the capacitances $C_{ci}$ and $C_{di}$ being approximately equal, so that the capacitance $C_{di}$ is several times the capacitance $C_{ci}$;

whereby an electric potential between said connection bus and said drift zone is principally produced across said capacitance $C_{ci}$ rather than across said capacitance $C_{di}$, so that said drift zone is effectively shielded from an electric field of said connection bus.

2. A high voltage MOS transistor as claimed in claim 1, wherein said closed layout plan is elongated in the same direction as that of said crossover path and said source and gate form a periphery of said layout plan.

3. A high voltage MOS transistor as claimed in claim 2, wherein at one end of said layout plan said drain has finger-like extensions which are interleaved with finger-like extensions of said source and gate, thereby increasing the effective lengths of said source, gate and drain.

4. A high voltage MOS transistor as claimed in claim 3, wherein a distance between said drain electrode and said gate electrode is greater at a second end of said layout plan opposite said one end thereof, said crossover path and said gap in said source and gate electrodes are at said second end of said layout plan so as to provide an increased length of said crossover path, and said connection bus traverses said crossover path and extends through said gap to exit from said transistor at said second end of said layout plan.

5. A high voltage MOS transistor as claimed in claim 3, wherein said drain electrode has a curvilinear shoulder opposite a corner of said layout plan so as to provide at such corner an increased length of said drift zone and of said crossover path between said drain electrode and said gate and source electrodes, said disjuncture in the gate and source electrodes is formed therein at said corner, and said connection bus extends over said crossover path and through the gap formed by said disjuncture to exit from the MOS transistor at said corner.

6. A high voltage MOS transistor as claimed in claim 1, wherein at said disjuncture in the gate and source electrodes a corresponding disjuncture is also formed in said source, each end of said disjuncture in said gate and source electrodes extends past the corresponding end of said disjuncture in said source, said gate continues without interruption across said disjuncture in the gate and source electrodes, and the crossover path formed by said succession of conductive strips continues across said gate and the disjuncture in said source; said strips supporting said connection bus for traversal of the gap formed by said disjuncture in the source and gate electrodes.

* * * * *

UNITED STATES PATENT AND TRADEMARK OFFICE
CERTIFICATE OF CORRECTION

PATENT NO. : 5,040,045

DATED : August 13, 1991

INVENTOR(S) : Douglas C. McArthur; Robert A. Mullen

It is certified that error appears in the above-identified patent and that said Letters Patent is hereby corrected as shown below: ON THE TITLE PAGE:

Item [73] Assignee: change "U.S. Philips Corporation, New York, NY" to --North American Philips Corporation, Signetics Division, Sunnyvale, California--.

Signed and Sealed this

Twelfth Day of January, 1993

Attest:

DOUGLAS B. COMER

Attesting Officer

Acting Commissioner of Patents and Trademarks